(12) United States Patent
Bour et al.

(10) Patent No.: US 7,585,769 B2
(45) Date of Patent: Sep. 8, 2009

(54) PARASITIC PARTICLE SUPPRESSION IN GROWTH OF III-V NITRIDE FILMS USING MOCVD AND HVPE

(75) Inventors: David Bour, Cupertino, CA (US); Jacob W. Smith, Santa Clara, CA (US); Sandeep Nijhawan, Los Altos, CA (US); Lori D. Washington, Union City, CA (US); David Eaglesham, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 316 days.

(21) Appl. No.: 11/429,022

(22) Filed: May 5, 2006

(65) Prior Publication Data

US 2007/0259502 A1 Nov. 8, 2007

(51) Int. Cl.
*H01L 21/44* (2006.01)

(52) U.S. Cl. .................. 438/681; 438/680; 438/763; 257/E21.09; 257/E21.121

(58) Field of Classification Search ................ 438/602, 438/603, 604, 642, 765; 257/E21.195
See application file for complete search history.

(56) References Cited

U.S. PATENT DOCUMENTS

| 4,147,571 | A | 4/1979 | Stringfellow et al. |
|---|---|---|---|
| 5,587,014 | A | 12/1996 | Leychika et al. |
| 5,665,986 | A | 9/1997 | Miura et al. |
| 5,843,590 | A | 12/1998 | Miura et al. |
| 6,031,252 | A | 2/2000 | Miura et al. |
| 6,156,581 | A | 12/2000 | Vaudo et al. |
| 6,218,280 | B1 | 4/2001 | Kryliouk et al. |
| 6,406,677 | B1 | 6/2002 | Carter et al. |
| 6,508,879 | B1 | 1/2003 | Hashimoto |
| 6,569,765 | B1 | 5/2003 | Solomon et al. |
| 6,656,285 | B1 | 12/2003 | Melnik et al. |
| 6,676,751 | B2 | 1/2004 | Solomon et al. |

(Continued)

OTHER PUBLICATIONS

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

(Continued)

*Primary Examiner*—Walter L Lindsay, Jr.
*Assistant Examiner*—Cheung Lee
(74) *Attorney, Agent, or Firm*—Townsend and Townsend and Crew, LLP

(57) ABSTRACT

A method of suppressing parasitic particle formation in a metal organic chemical vapor deposition process is described. The method may include providing a substrate to a reaction chamber, and introducing an organometallic precursor, a particle suppression compound and at least a second precursor to the reaction chamber. The second precursor reacts with the organometallic precursor to form a nucleation layer on the substrate. Also, a method of suppressing parasitic particle formation during formation of a III-V nitride layer is described. The method includes introducing a group III metal containing precursor to a reaction chamber. The group III metal precursor may include a halogen. A hydrogen halide gas and a nitrogen containing gas are also introduced to the reaction chamber. The nitrogen containing gas reacts with the group III metal precursor to form the III-V nitride layer on the substrate.

38 Claims, 10 Drawing Sheets

U.S. PATENT DOCUMENTS

| | | | |
|---|---|---|---|
| 6,706,119 | B2 | 3/2004 | Tsvetkov et al. |
| 6,900,067 | B2 | 5/2005 | Kobayashi et al. |
| 2001/0037760 | A1* | 11/2001 | Solomon et al. ............. 117/97 |
| 2002/0174833 | A1* | 11/2002 | Tsvetkov et al. ............ 118/724 |
| 2004/0115853 | A1* | 6/2004 | Kobayashi et al. ............ 438/47 |

OTHER PUBLICATIONS

Coltrin, M.E. et al., "Chemistry of AtGaN Particulate Formation," National Nuclear Secu5rity Administration, Physical, Chemical, & Nano Sciences Center, Research Briefs, 2005, pp. 42-43.

Kumagai, Yoshinao et al., "Growth of Thick Hexagonal GaH Layer on GaAs (111) A Surfaces for Freestanding GaN by Metalorganic Hydrogen Chloride Vapor Phase Epitaxy," Jpn. J. Appl. Phys., vol. 39 (2000), pp. L703-L706.

Kumagai, Yoshinao et al., "Investigation of Substrate Orientation Dependence for the Growth of GaN on GaAs (111)A and (111)B Surfaces by Metalorganic Hydrogen Chloride Vapor-Phase Epitaxy," Jpn. J. Appl. Phys., vol. 39 (2000) pp. L149-L151.

Miura, Yoshiki, "New Epitaxial Growth Method of Cubic GaN on (100) GaAs Using $(CH_3)_3Ga$, HCl and $NH_3$," Jpn. J. Appl. Phys., vol. 34 (1995) pp. L401-L404.

* cited by examiner

PARASITIC PARTICLE SUPPRESSION IN GROWTH OF III-V NITRIDE FILMS USING MOCVD AND HVPE

CROSS-REFERENCES TO RELATED APPLICATIONS

This application is related to co-assigned U.S. patent application Ser. No. 11/404,516, by Nijhawan et al, and titled "EPITAXIAL GROWTH OF COMPOUND NITRIDE SEMICONDUCTOR STRUCTURES", the entire contents which is hereby incorporated by reference for all purposes.

BACKGROUND OF THE INVENTION

Group III-V semiconductors are increasingly being used in light-emitting diodes (LEDs) and laser diodes (LDs). Specific III-V semiconductors, such as gallium nitride (GaN), are emerging as important materials for the production of shorter wavelength LEDs and LDs, including blue and ultra-violet emitting optical and optoelectronic devices. Thus, there is increasing interest in the development of fabrication processes to make low-cost, high-quality III-V semiconductor films.

One widely used process for making III-V nitride films like GaN is hydride vapor-phase epitaxy (HVPE). This process includes a high-temperature, vapor-phase reaction between gallium chloride (GaCl) and ammonia ($NH_3$) at a substrate deposition surface. The GaCl precursor is produced by passing hydrogen chloride (HCl) gas over a heated, liquid gallium supply (melting point 29.8° C.). The ammonia may be supplied from a standard gas source. The precursors are brought together at the heated substrate, where they react and deposit a layer of GaN. The HVPE deposition rate is high (e.g., up to 100 μm/hr) and provides a relatively fast and cost effective method of making GaN films.

However, the HVPE also has drawbacks for forming GaN and other III-V compound films. The HCl gas is not completely consumed when forming the GaCl, and the substrate is exposed to significant amounts of HCl during film deposition. For substrates like silicon that are etch-sensitive towards HCl, a pre-film anti-etch layer needs to be deposited to protect the substrate from being damaged or destroyed. The additional layer needs to be carefully selected so that it minimally interferes with the formation of the GaN film. At the very least, the formation of the anti-etch layer will add additional cost and time to the GaN film deposition process.

In addition, the high deposition rates that characterize HVPE processes make them difficult to use with low levels of dopant materials. Dopants are often important to define the electrical and optoelectronic properties of a III-V compound LED, LD, transistor, etc. Doping steps done after the GaN film is deposited may not provide an adequate concentration or homogeneity of the dopant in the film. When post-deposition doping is possible at all, it will at the very least add additional cost and time to the GaN film deposition process.

Another major drawback of HVPE is the difficulty of using the process to grow alloys of III-V nitrides, such as aluminum gallium nitride (AlGaN) and indium gallium nitride (InGaN). These and other nitride alloys offer a much larger variety of heterostructures than single-metal nitrides, and are already suggesting many new optoelectronic device applications. But unfortunately generating stable gas precursors for aluminum (e.g., aluminum chloride) and indium (e.g., indium chloride) has proven more difficult than the generation of GaCl.

For example, aluminum has a much higher melting point (about 660° C.) than gallium, and the chloride salt of aluminum ($AlCl_3$) quickly solidifies into a low vapor pressure solid even under high-temperature HVPE reactor conditions. When HCl passes over aluminum metal, most of the $AlCl_3$ precipitates out of the gas flow, and only a small fraction reaches the deposition substrate to react with a nitrogen precursor and form AlN.

To overcome these and other shortcomings of HVPE III-V compound film formation, another process called metal-organic chemical vapor deposition (MOCVD) is used to form III-V nitride films. MOCVD uses a reasonably volatile metallorganic Group III precursor such as trimethylgallium (TMGa) or trimethylaluminum (TMAl) to deliver the Group III metal to the substrate where it reacts with the nitrogen precursor (e.g., ammonium) to form the III-V nitride film.

MOCVD nitride films are typically deposited at lower temperature than HVPE films, allowing the fabrication process to have a lower thermal budget. It is also easier to combine two or more different Group III metallorganic precursors (e.g., Ga, Al, In, etc.) and make alloy films of GaN (e.g., AlGaN, InGaN, etc.). Dopants may also be more easily combined with the precursors to deposit an in-situ doped film layer.

MOCVD film depositions, however, also have drawbacks. These include slower deposition rates for MOCVD than HVPE. MOCVD typically deposits a film at about 5 μm/hr or less compared with 50 μm/hr for HVPE. The slower deposition times make MOCVD a lower throughput and more expensive deposition process than HVPE.

Several approaches have been tried to increase the throughput of GaN depositions with MOCVD: In one approach, batch reactors have been tried that are capable of simultaneously growing films on many wafers or over large areas. In a second approach, attempts were made to increase the rate of GaN film growth and heterostructures. Both approaches have had difficulties.

Scale up to large areas has proved difficult because the GaN must be grown at relatively high pressures (e.g., several hundred Torr), and at these pressures the flow velocity in a large reactor is low, unless the total flow through the reaction is made extraordinarily high. Consequently, the precursor stream becomes depleted of reactants over a short distance, making it difficult to grow a uniform film over a large area.

Attempts to increase the deposition rates of a GaN film by increasing the concentration (i.e., partial pressures) of the organo-gallium and ammonia precursors have also proved difficult. FIG. 1A shows a graph of a growth rate for a GaN film as a function of the total pressure in the MOCVD reactor. These graphs are based on simulations by STR of GaN film growth in a Thomas Swan reactor with a close-coupled showerhead injector. The graph shows a steep drop in the rate as the pressure in the reactor increases above about 300 torr.

The decrease in GaN film growth rate with increasing MOCVD reactor pressure is attributed to the formation of gas-phase parasitic particles that consume the Ga and N precursors that would otherwise be used to grow the film. These parasitic particles form in a thin thermal boundary layer over the wafer substrate, where local gas temperatures become sufficiently high to promote a pyrolytic reaction between the Group III precursors and ammonia (the nitrogen precursor). Once formed, the hot, suspended (by thermophoresis) particles become nuclei for additional deposition, thereby growing and further depleting reactants from the gas stream, until they are flushed out of the chamber. Thus, there is competition between the desired film growth and the parasitic particle growth. Parasitic particle formation increases when the partial pressures of the Group III and/or Group V precursors increase, or when the thermal boundary layer around the wafer substrate is expanded.

In the case of GaN films grown with a trimethylgallium precursor, the film growth rate eventually saturates with respect to the trimethylgallium flow, making it difficult to realize growth rates greater than about 5 μm/hr. The formation of the parasitic particles can also degrade the optoelectronic qualities of the deposited GaN film.

Because the parasitic particle formation depends on the partial pressures of the Group III and V precursors, it may be possible to increase the growth rate of the MOCVD deposited film by diluting the precursor gas stream with more carrier gas (e.g., hydrogen ($H_2$), helium, etc.). However, attempts to dilute the precursor gas stream hurt the quality of the III-V film that was deposited. Maintaining high partial pressures of the precursors, especially a high ammonia partial pressure in the case of nitride film depositions, appears to be beneficial in the growth of high quality films.

Parasitic particle formation in MOCVD film depositions can be even more severe for alloys of gallium nitride. FIG. 1B, for example, shows a graph of a STR simulation of the deposition rate of AlGaN as a function of the pressure in an Aixtron planetary reactor. The graph shows an even steeper drop off in the film formation rate versus reactor pressure during the formation of a AlGaN film than for an unalloyed GaN film. Similar decreases in film growth rates were shown in simulations for Thomas Swan and Veeco reactor geometries.

AlGaN films are used in LED heterostructures where a p-type layer is grown over a InGaN well active region. It is therefore beneficial to grow the AlGaN film with a reasonably high hole concentration, and free of nanradiative or compensating defects. Unfortunately, high total pressures and high ammonia flows are best for growing AlGaN films with these qualities, but growing these films with the requisite Al content by MOCVD is extremely challenging due to the formation of the parasitic particles.

In another example, InGaN film growth is also limited by parasitic particle formation. FIG. 1C shows a graph of an InGaN film growth rate as a function of reaction pressure. The graph was derived from growth simulation done with a Thomas Swan showerhead reactor geometry at various pressures. While the formation of parasitic particles in MOCVD depositions of InGaN is not as pronounced as for AlGaN, it is still significant enough to limit the growth rate of the films. InGaN films have applications in the quantum well active regions of laser diodes and LEDs. Without the formation of the parasitic particles, growth of InGaN films could be performed at higher pressures and higher ammonia flow, both of which would be beneficial for the optoelectronic quality (e.g., high internal efficiency) and p-type doping in LDs and LEDs. Thus, there is a need for systems and methods that control parasitic particle formation while increasing the throughput of MOCVD formed III-V nitride films.

BRIEF SUMMARY OF THE INVENTION

Embodiments of the invention include methods of suppressing parasitic particle formation in a metal organic chemical vapor deposition process. The methods may include the steps of providing a substrate to a reaction chamber, introducing an organometallic precursor and a particle suppression compound to the reaction chamber, and introducing at least a second precursor to the reaction chamber. The second precursor reacts with the organometallic precursor, and forms a nucleation layer on the substrate from a reaction mixture that includes the organometallic precursor and the second precursor.

Embodiments of the invention also include methods of suppressing parasitic particle formation during formation of a III-V nitride layer. The methods may include the steps of providing a substrate to a reaction chamber, and introducing a group III metal containing precursor to the reaction chamber. The group III metal precursor may also include a halogen, where the halogen suppresses the parasitic particle formation. The method may also include the steps of introducing a hydrogen halide gas to the reaction chamber (where the hydrogen halide also suppresses the parasitic particle formation) and introducing a nitrogen containing compound to the reaction chamber. The nitrogen containing compound reacts with the group III metal precursor to form the III-V nitride layer on the substrate.

Embodiments of the invention still further include methods of suppressing parasitic particle formation during formation of a gallium nitride layer on a sapphire substrate. The methods may include the steps of introducing ammonia to a reaction chamber that contains the sapphire substrate, and introducing an organo-gallium compound and hydrogen chloride to a reaction chamber. The hydrogen chloride suppresses the formation of parasitic particles by the ammonia. The methods also include forming a gallium nitride layer on the sapphire substrate.

Embodiments of the invention still also include methods of suppressing parasitic particle formation during formation of a gallium nitride layer on a substrate. The methods may include the steps of introducing ammonia to a reaction chamber that contains the sapphire substrate, and introducing an organo-gallium compound and a halogen containing gallium compound to the reaction chamber. The halogen containing gallium compound suppresses the formation of parasitic particles by the ammonia. The method also includes forming a gallium nitride layer on the substrate.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods to suppress the formation of parasitic particles during the deposition of a III-V layer with metal-organic chemical vapor deposition (MOCVD) are described. A particle suppression compound such as a hydrogen halide (e.g., HCl) may be introduced with a Group III metal-organic precursor (e.g., an alkyl gallium precursor) and/or a Group V precursor (e.g., ammonia) to suppress the formation of parasitic III-V particles in the space above a substrate. The partial pressure of the particle suppression compound (or compounds) may be less than the partial pressures of either the Group III or Group V precursors during the deposition of the III-V layer.

The particle suppression compounds allow the Group III and Group V precursors to be supplied to the reaction chamber at higher partial pressures than would otherwise be possible for growing high quality III-V films with MOCVD. The ability to increase the partial pressures of the film forming precursors without also forming more parasitic particles allows the III-V films to be grown at faster deposition rates (e.g., rates of about 5 μm/hr or more), and with higher optoelectronic quality (e.g., higher internal efficiency, superior p-type doping, etc.) than films grown at lower reactor pressures.

Exemplary III-V Film Structures

Figure 1A:
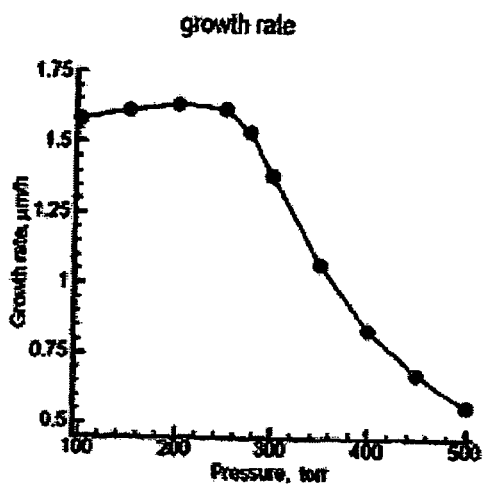
FIGS. 1A-C are graphs plotting the deposition rates of III-V nitride films as a function of pressure in a reaction chamber.
Figure 1B:
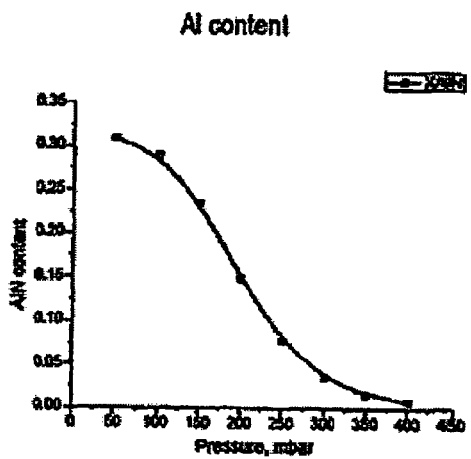
Figure 1C:
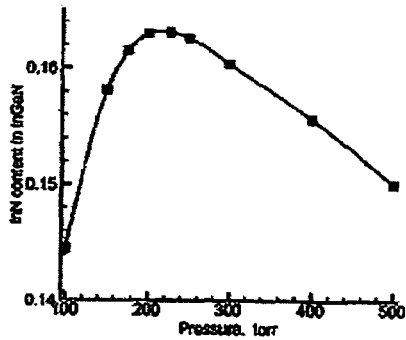
Figure 2:
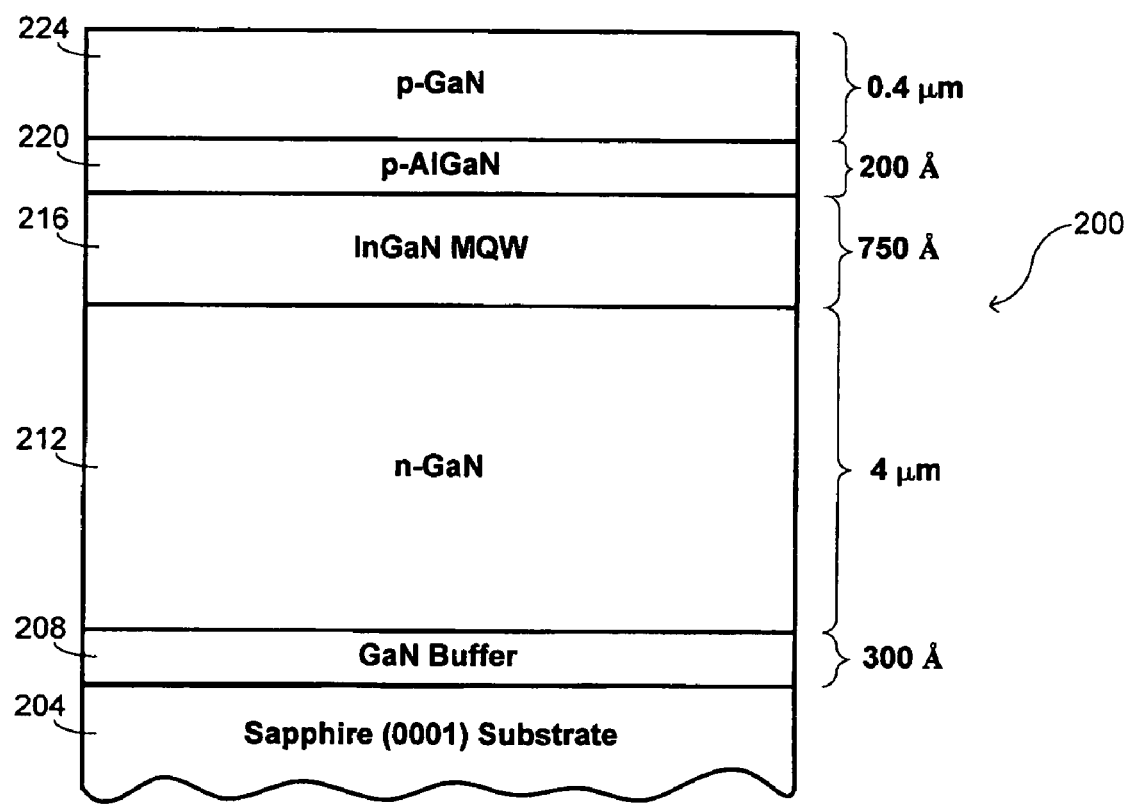
FIG. 2 provides a schematic illustration of a structure of a GaN-based LED.

Embodiments of the systems and methods described may be used to form III-V devices that act as light emitting diodes and/or laser diodes, among other devices. FIG. 2 shows an example of a III-V device that may be made using the present systems and methods. A GaN-based LED structure 200 is shown formed over a sapphire (0001) substrate 204. An n-type GaN layer 212 is deposited over a GaN buffer layer 208 formed over the substrate. An active region of the device is embodied in a multi-quantum-well layer 216, shown in the drawing to comprise an InGaN layer. A pn junction is formed with an overlying p-type AlGaN layer 220, with a p-type GaN layer 224 acting as a contact layer.

Other III-V devices may also be made by the present invention, including laser diodes (LDs), high-electron mobility transistors, and other opto-electronic devices.

Exemplary Fabrication Methods

Figure 3:
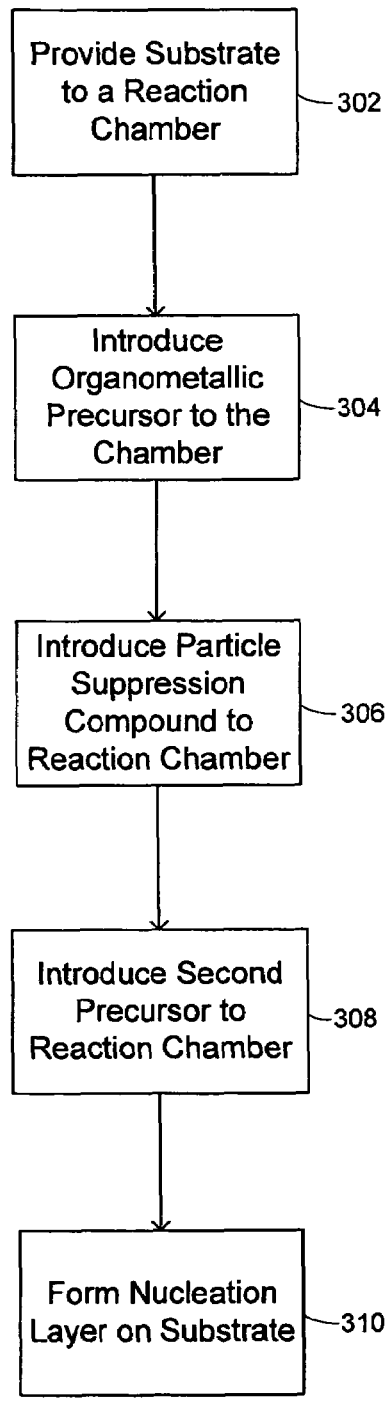
FIG. 3 is a flowchart illustrating steps in processes of forming a nucleation layer on a substrate according to embodiments of the invention.

FIG. 3 shows a flowchart illustrating steps in processes 300 of forming a nucleation layer on a substrate according to embodiments of the invention. The process 300 includes providing a substrate upon which the nucleation layer will be formed to a reaction chamber 302. The substrate may be any substrate that a group III-V nucleation layer can be formed by either MOCVD or hydride vapor phase epitaxy (HVPE). These may include, for example, substrate wafers made from sapphire ($Al_2O_3$), substantially pure silicon (Si), silicon carbide (SiC), spinel, zirconium oxide, as well as compound semiconductor substrates such as gallium-arsenide (GaAs), lithium gallate, indium phosphate (InP), and single-crystal GaN among other substrates.

With the substrate in the reaction chamber, the film forming and particle suppression precursors may be introduced to start the deposition of the nucleation layer. In the flowchart shown in FIG. 3, embodiments of the process may include introducing an organometallic precursor to the reaction chamber 304. The organometallic precursor may include a Group III metal and a carbon group, among other constituents. For example, the precursor may include an alkyl Group III metal compound such as an alkyl aluminum compound, an alkyl gallium compound, and/or an alkyl indium compound, among others. Specific precursor examples may include trimethylaluminum (TMA), triethyl-aluminum (TEA), trimethylindium (TMI), triethylindium (TEI), trimethylgallium (TMG), and triethylgallium (TEG). Larger sized alkyl groups, such as propyl, pentyl, hexal, etc., may also be combined with the Group III metal. Different sized alkyl groups may also be combined in the same precursor, such as ethyldimetylgallium, methyldiethyl-aluminum. etc. Other organic moieties such as aromatic groups, alkene groups, alkyne groups, etc. may also be part of the organometallic precursor.

Two or more organometallic precursors may be introduced to the reaction chamber to react and form a layer that includes a metallic alloy. For example, the organometallic precursors may include two or more Group III metals (e.g., Al, Ga, In) that form a nitride of a Group III alloy on the substrate, such as AlGaN, InGaN, InAlN, InAlGaN, etc. In AlGaN, for example, TMG and TMA may be introduced together into the reaction chamber with a nitrogen precursor (e.g., ammonia) to form the alloyed III-V layer.

The organometallic precursor may also be a halogenated precursor, with the halogen group attached to either the metal atom, the organic moiety, or both. Examples include diethylgallium chloride, chloromethlydiethylgallium, chlorodiethylgallium chloride, etc. When the organometallic precursor includes a halogen group, the dissociated halogen may act as a particle suppression constituent during the reaction and deposition of the nucleation layer. In some embodiments, the halogenated organometallic precursor may act as both the particle suppression compound and a Group III metal providing compound during the deposition of the nucleation layer. Embodiments also include providing a halogenated organometallic compound in addition to a separate particle suppression compound.

A particle suppression compound may be introduced to the reaction chamber 306 in the same fluid stream as the organometallic precursor, or a separate stream. The particle suppression compound may reduced the number of parasitic particles that form in the reaction zone above the wafer substrate by 10%, 20%, 30%, 40%, 50%, 60%, 70%, 80%, 90% or more, compared to a fabrication without the compound.

The particle suppression compound (or compounds) may be introduced into the reaction chamber at a concentration (i.e., partial pressure) that is the same or less than the concentration of the organometallic precursor. Embodiments, for example, may have the particle suppression compound introduced at a partial pressure less than either the organometallic and/or another precursor used to form the nucleation layer.

Specific examples may include introducing the particle suppression compound at a partial pressure that is less than half, less than one quarter, less than one fifth, less than one sixth, less than one tenth, etc., the partial pressure of the organometallic precursor introduced into the reaction chamber.

The particle suppression compound may include a halogen group. For example, the particle suppression compound may be a hydrogen halide such as hydrogen fluoride, hydrogen chloride, hydrogen bromide and/or hydrogen iodide. Particle suppression compounds may also include organo-halogen compounds such as an alkyl chloride (e.g., methyl chloride, methylene chloride, chloroform, etc.). As noted above, embodiments also include halogen containing organometallic precursors and/or other halogen containing reactants involved in the formation of the nucleation layer.

A second precursor may be introduced to the reaction chamber 308 that reacts with the organometallic precursor in a reaction zone around the deposition surface of the substrate. When the nucleation layer is a metal-nitride layer, the second precursor may be a nitrogen containing precursor, such as ammonia ($NH_3$). The second precursor may flow in a separate gas stream into the reaction chamber that intersects with the organometallic precursor gas stream in a space in the heated reaction zone above the substrate.

Carrier gases such as helium may be used to facilitate the flow of the precursors and particle suppression compounds in the reaction chamber, as well as adjust the total pressure in the chamber. The carrier gas may be premixed with the precursor gas before entering the chamber, and/or may enter the chamber in a unmixed state through a separate flow line.

When the precursors react in the reaction zone, least a portion of the reaction products forms the nucleation layer on the substrate 310. The nucleation layer deposition rate and film properties may be controlled, at least in part, by adjustable parameters of the reaction chamber, including the chamber temperature, pressure, and fluid flow rate, and partial pressures of the precursors, carrier gases and particle suppression compound(s).

For example, the temperature of the reaction zone around the substrate wafer may be adjusted from about 23° C. to about 1100° C. by an external heat source surrounding the reaction chamber. The heat source heats the walls of the reactor (i.e., a hot-walled reaction chamber), which in turn heats the substrate. Under hot-walled reactor conditions, the precursors are heated as they enter the reaction chamber, and can react around the chamber walls as well as the substrate. Because a large amount of precursor reacts away from the substrate surface, the precursor yield (i.e., amount of deposited film versus amount of precursor used) from a hot-walled MOCVD chamber is typically lower than for a cold-walled system.

In a cold-walled reaction chamber, the substrate is heated without first heating the chamber walls. Substrate heating may be done by heating a substrate support structure, heating one or more streams of gases (e.g., the precursors) directed at the substrate, generating a plasma proximate to the substrate, and training a beam of light (e.g., infrared light) on the substrate, among other techniques. Because the highest temperature region in the reaction chamber is more concentrated around the deposition surface of the substrate, less precursor reacts away from the substrate and the precursor yield is generally higher than for hot-walled processes.

The deposition rate and film quality of the nucleation layer may be determined, in part, by the temperature of the substrate. The temperature of the substrate during deposition may be, for example, up to about 200° C., 300° C., 400° C., 500° C., 600° C., 700° C., or 700° C. or more. The temperature of the substrate may be adjusted, in part, by controlling the temperature of the of the streams of precursor gases entering the reaction chamber and surrounding the substrate. For example the precursor gases introduced to the reaction chamber may have a temperature ranging from about 15° C. to about 300° C., 400° C., 500° C., 600° C., or 700° C. or more.

The reactor pressure may also be set during the deposition of the nucleation layer. The processing conditions used for deposition of the nucleation layer may vary depending on specific applications. The following table provides exemplary processing conditions and precursor flow rates that are generally suitable in the growth of III-V nucleation layers:

| Parameter | Value |
| --- | --- |
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

The reaction chamber conditions may be set to form the nucleation layer with a deposition rate of, for example, about 2 μm/hr or more, about 5 μm/hr or more, about 10 μm/hr or more, about 25 μm/hr or more, or about 50 μm/hr or more. The deposition time may be, for example, about 1, 5, 10, 15, 20, 30, 45, or 60 minutes or more to form a nucleation layer having a thickness of about 100 Å to about 1000 Å.

Figure 4:
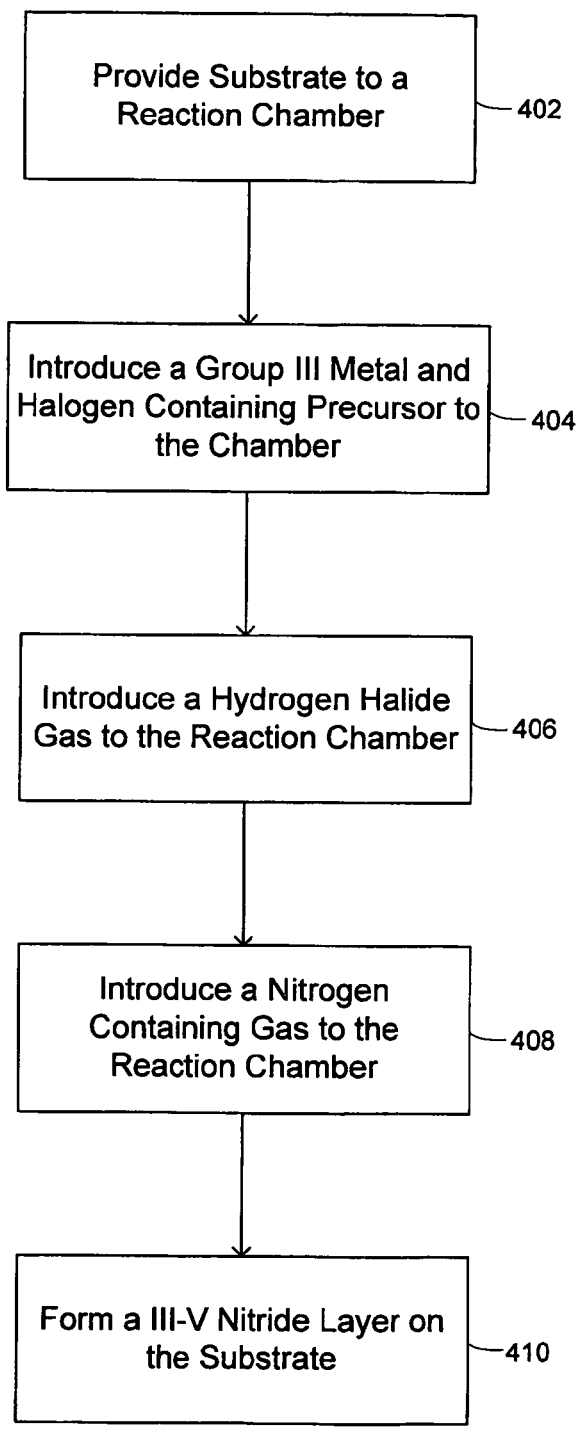
FIG. 4 is a flowchart showing steps in processes of forming a III-V nitride layer on a substrate according to embodiment of the invention.

Referring now to FIG. 4, a flowchart including steps in a process 400 of forming a III-V nitride layer on a substrate according to embodiments of the invention is shown. process 400 includes providing a substrate to the reaction chamber 402. It also includes introducing a Group III metal and halogen containing precursor to the reaction chamber 404. This precursor may be, for example, a Group III metal fluoride, chloride, bromide and/or iodide (e.g., $AlF_3$, $AlCl_3$, $AlBr_3$, $AlI_3$, GaF, GaCl, GaBr, GaI, InF, InCl, InBr, InI, etc.). It may also be a Group III organometallic halide (e.g., dimethylgallium chloride) and/or a Group III metal organohalide compound (e.g., trichloromethylgallium).

The process 400 may also include introducing a separate hydrogen halide to the reaction chamber 406 in the same or different precursor stream as the Group III metal precursor. The hydrogen halide may include HF, HCl, HBr, or HI, alone or in combination. The hydrogen halide acts as a parasitic particle suppression compound that suppresses the formation and growth of Group III metal nitride particles in the reaction chamber.

A nitrogen containing gas may also be introduced into the reaction chamber 408 to provide the Group V (i.e., nitride) component of the III-V nitride film. The nitrogen containing gas may include nitrogen ($N_2$), ammonia ($NH_3$), hydrazine, dimethylhydrazine, phenylhydrazine, excited nitrogen, among other nitrogen containing precursors.

The Group III metal and halogen containing precursor reacts with the nitrogen containing precursor to form the III-V nitride layer on the substrate 410. The dissociated halogens from the Group III metal precursor and the hydrogen halide present in the reaction zone around the substrate slow the formation of parasitic Group III metal nitride particles. The III-V nitride layer may be a single metal Group III metal nitride such as AlN, GaN, or InN, or an alloy of two or more Group III metals and nitrogen, such as AlGaN, AlGaIn, etc.

The process 400 may be repeated two or more times with changes in the substrate temperature, reaction chamber pressure, and/or composition of the precursors to form a multi-level stack of Group III metal nitride layers. For example, the process 400 may be used to first form a GaN buffer layer on the substrate, followed by a n-GaN doped layer, then a InGaN alloy, then a p-AlGaN doped layer, and finally a top p-GaN doped layer similar to the GaN-based LED structure 200 shown in FIG. 2.

Figure 5:
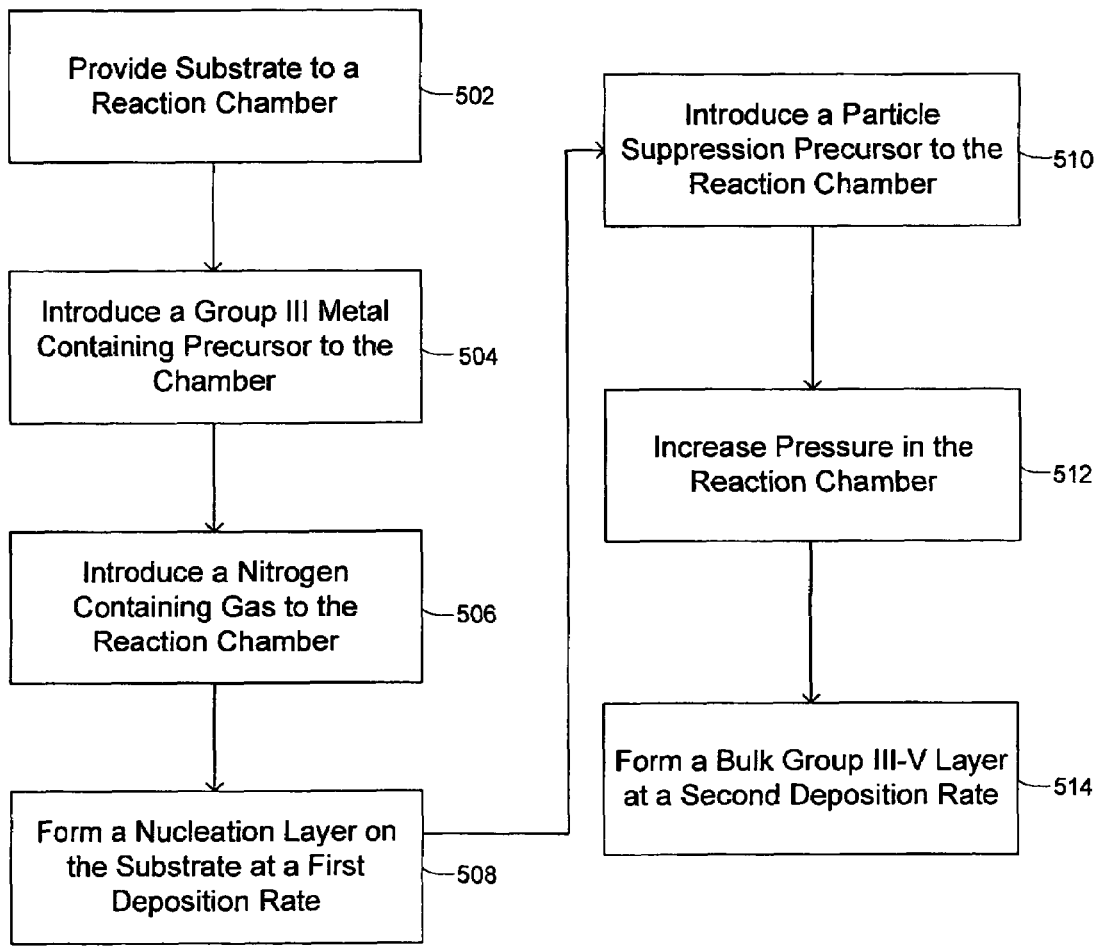
FIG. 5 is a flowchart showing steps in multi-stage processes of forming a III-V layer on substrate according to embodiments of the invention.

FIG. 5 shows steps in a multi-stage process 500 of forming a III-V layer on substrate according to embodiments of the invention. In this process 500, a thinner nucleation layer and thicker bulk III-V nitride layer are deposited by MOCVD on a substrate. The process 500 starts with providing a substrate to a reaction chamber 502. The reaction chamber may be a dedicated MOCVD chamber or a hybrid chamber that can perform both MOCVD and HVPE depositions.

A first stage of the process is then begun that include introducing a Group III Metal precursor 504 (e.g., TMG) and a nitrogen containing gas 506 (e.g., $NH_3$) to the reaction chamber. The precursor and gas then react and for a nucleation layer on the substrate at a first deposition rate 508. The nucleation layer generally has a thickness of about 1000 Å or less (e.g., about 100 Å to about 1000 Å) and may be deposited at a lower deposition rate than the bulk III-V nitride layer. The deposition rate for the nucleation layer may be sufficiently low (e.g., less than 5 µm/hr) that the partial pressures of the precursors are set at levels that do not form significant numbers of parasitic particles. Thus, a particle suppression compound may not be introduced to the reaction chamber at this stage.

However, following the formation of the nucleation layer, it may be desired to increase the deposition rate to form the bulk nitride layer. Thus, once the nucleation layer is formed, a particle suppression compound (e.g., HCl) may be introduced into the reaction chamber 510. The particle suppression compound may be introduced as the Group III metal precursor and nitrogen containing gas are still flowing in the reaction chamber, and may be introduced as the flow rate of one or both precursors is increasing. Alternatively, the flow of the precursors that formed the nucleation layer may be stopped before the precursors and particle suppression compound are introduced to form the bulk nitride layer. In the intervening period between stopping the nucleation precursors and starting the bulk layer precursors, additional steps may be performed on the nucleation layer coated substrate, such as an anneal, an etch, etc., (not shown).

The introduction of the particle suppression compound allows the pressure in the reaction chamber to be increased 512 without a commensurate increase in the number of parasitic particles being formed. Increasing the pressure in the reaction chamber by increasing the partial pressures of a Group III metal precursor and/or nitrogen precursor will allow the bulk Group III-V layer to be formed at a second, faster, deposition rate 514 than the first deposition rate for the nucleation layer. For example, the bulk III-V layer deposition rate may be between about 5 µm/hr to about 50 µm/hr (e.g., 5, 6, 7, 8, 9, 10, 12, 15, 25, 35, 40, 45, or 50 µm/hr). The deposition of the bulk III-V layer ends when the layer reaches a predetermined thickness (e.g., about 1 µm to about 5 µm thick).

Figure 6:
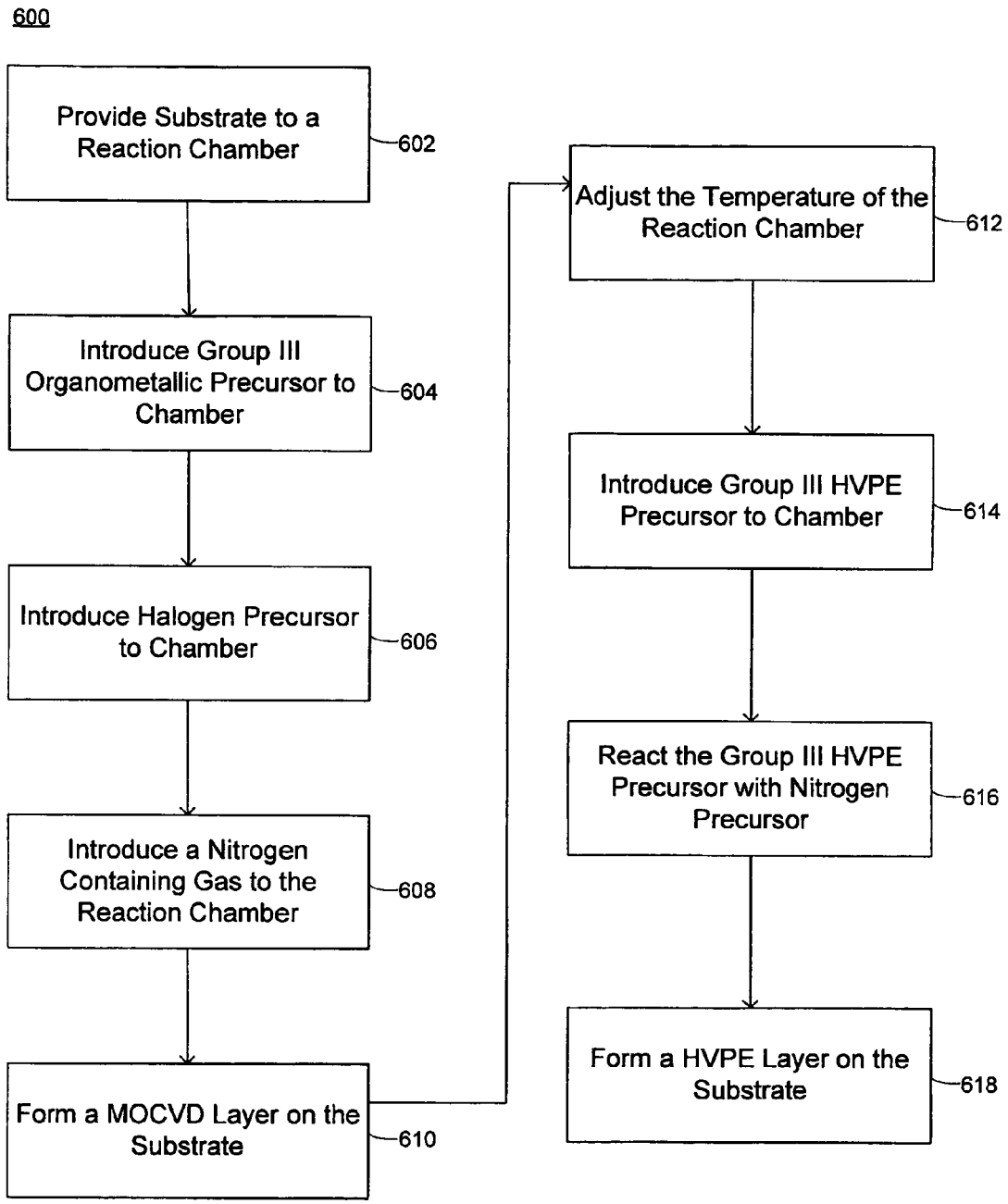
FIG. 6 is a flowchart illustrating steps in combined MOCVD and HVPE processes of forming III-V layers according to embodiments of the invention.
Figure 7:
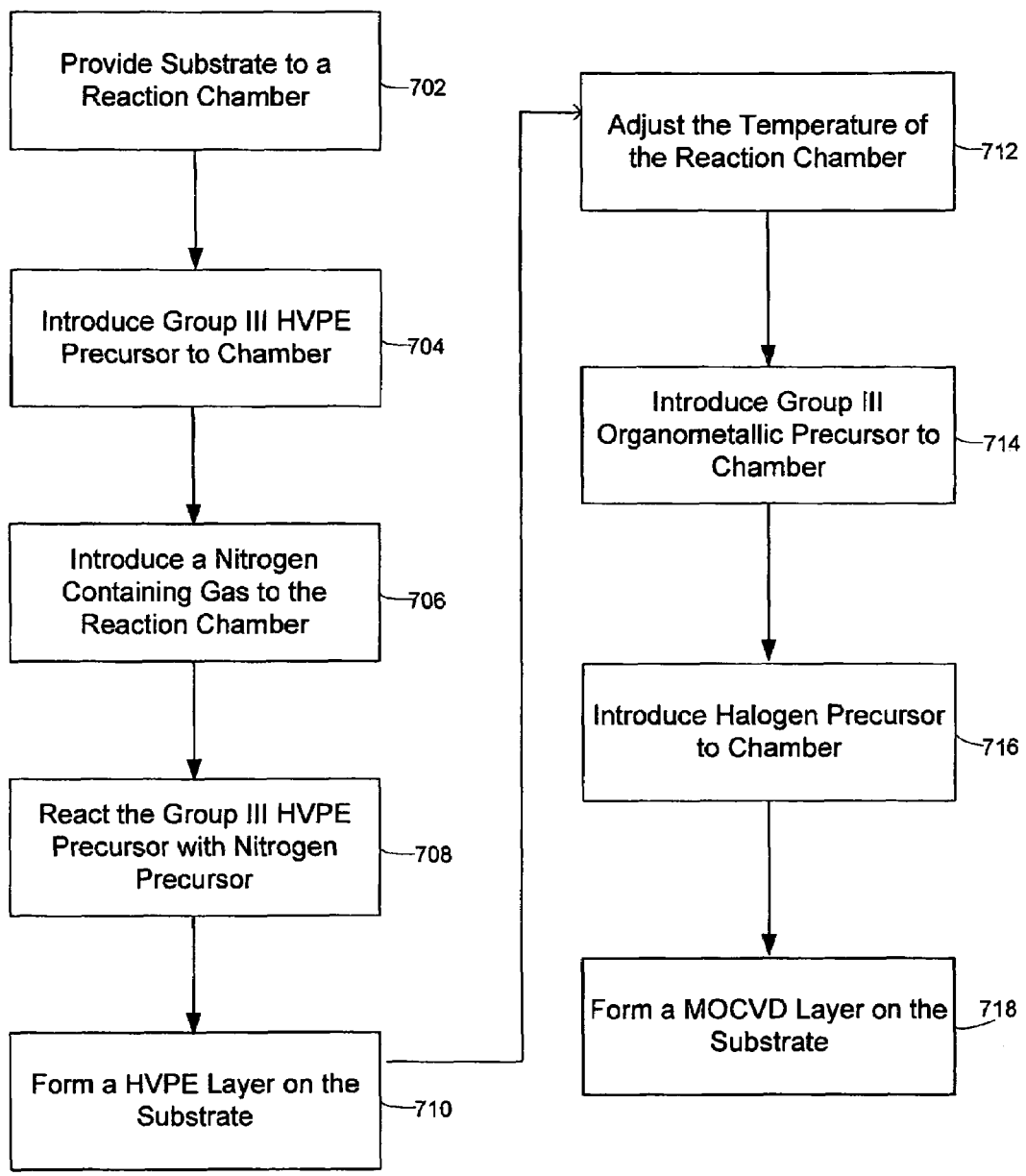
FIG. 7 is a flowchart illustration steps in combined HVPE and MOCVD processes of forming III-V layers according to embodiments of the invention.

The multi-stage process illustrated in FIG. 5 uses MOCVD to deposit both the nucleation layer and the bulk Group III-V layer on a substrate. FIGS. 6 and 7 are flowcharts illustrating additional processes where combinations of MOCVD and HVPE are used to form Group III-V films on a substrate.

FIG. 6 is a flowchart illustrating steps in a combined MOCVD and HVPE process 600 of forming III-V layers according to embodiments of the invention. In this process, MOCVD is used to form a first MOCVD layer (e.g., a III-V nucleation layer) on a substrate, and HVPE is used to form a second HVPE layer (e.g., a bulk III-V layer). The process 600 may include providing a substrate to a reaction chamber 602. A Group III organometallic precursor may be introduced to the reaction chamber 604, and a halogen precursor may also be introduced 606. The halogen precursor (e.g., HCl) may function as a parasitic particle suppression compound, and may be introduced at a flow rate and/or partial pressure that is significantly lower than the Group III organometallic precursor. For example, the halogen containing compound may be introduced at a partial pressure that is about one half, one third, one fourth, one fifth, one sixth, one seventh, one eighth, one ninth, one tenth, one twentieth, one fiftieth, one one-hundredth, one less the partial pressure of the Group III organometallic precursor.

A nitrogen precursor may also be introduced into the reaction chamber 608. The nitrogen precursor (e.g., ammonia) may be introduced with about the same or higher flow rate and/or partial pressure as the Group III organometallic precursor, and may be introduced at the same or lower flow rate and/or partial pressure than the halogen precursor.

The Group III organometallic precursor and the nitrogen precursor may react and form the MOCVD layer on the substrate 610. The MOCVD layer may be formed at a rate of up to 5 µm/hr or more, and may have a thickness of about 10 Å to about 1 µm.

Following the deposition of the MOCVD layer, the temperature of the reaction chamber may be adjusted 612 for the deposition of a HVPE layer. Typically, the temperature is increased for the deposition of the HVPE layer. For example, HVPE deposition temperatures for forming a III-V nitride layer are about 550° C. to about 1100° C. (e.g., about 800° C. to about 1000° C.). This may be higher than the temperatures typically used to form a III-V nitride layer by MOCVD (e.g., about 100° C. to about 700° C., commonly about 300° C. to about 700° C.).

The Group III HVPE precursor may then be introduced to the reaction chamber 614. The Group III HVPE precursor may be formed by passing a halogen gas (e.g., HCl) over a heated Group III metal (e.g., liquid gallium, aluminum and/or indium). The halogen gas an metal vapor react to form a metal halide (e.g., GaCl) that is introduced into the reaction chamber by a carrier gas (e.g., helium, hydrogen).

The Group III HVPE precursor may react with a nitrogen precursor 616 in the reaction chamber. At least a portion of the reaction products are deposited onto the substrate to form a HVPE layer 618 on the MOCVD layer. The HVPE layer may be formed at a faster deposition rate (e.g., up to about 50 µm/hr) than the MOCVD layer. The HVPE layer may also be thicker than the MOCVD layer (e.g., 2, 3, 4, 5, 6, 10, 20, or more times the thickness of the MOCVD layer).

The process 600 described in FIG. 6, may be carried out in a single reaction chamber capable of performing both MOCVD and HVPE, or separate reaction chambers dedicated to a single deposition technique. The system used to perform the process 600 may also include reaction chambers of etching, lithography, and annealing, among other additional process steps.

In FIG. 6, the process 600 used MOCVD to from a first layer on the substrate and HVPE to form a second layer on the first layer. FIG. 7 shows embodiments of a process 700 that reverses the HVPE and MOCVD deposition sequence by forming the HVPE layer before the MOCVD layer. The process 700 may start the same by providing a substrate to a reaction chamber 702. However, a Group III HVPE precursor is introduced first to the reaction chamber 704, along with a nitrogen containing gas 706. The Group III HVPE precursor and nitrogen containing gas react 708 to form a first HVPE layer on the substrate 710.

When the process 600 is performed in a single reaction chamber, the process conditions in the chamber may be reconfigured for the second, MOCVD deposition. This reconfiguration may include stopping the flow of the Group III HVPE precursor, and adjusting the temperature of the reaction chamber 712 for the MOCVD deposition. Typically, this means decreasing the temperature of the reaction chamber. A Group III organometallic precursor may then be introduced into the reaction chamber 714 along with a halogen precursor 716 and the nitrogen containing gas to form the MOCVD layer on the HVPE layer and the substrate 718. The nitrogen containing gas may flow continuously during the deposition of the HVPE and MOCVD layer, or may be stopped between the depositions.

Exemplary Substrate Processing System

Figure 8A:
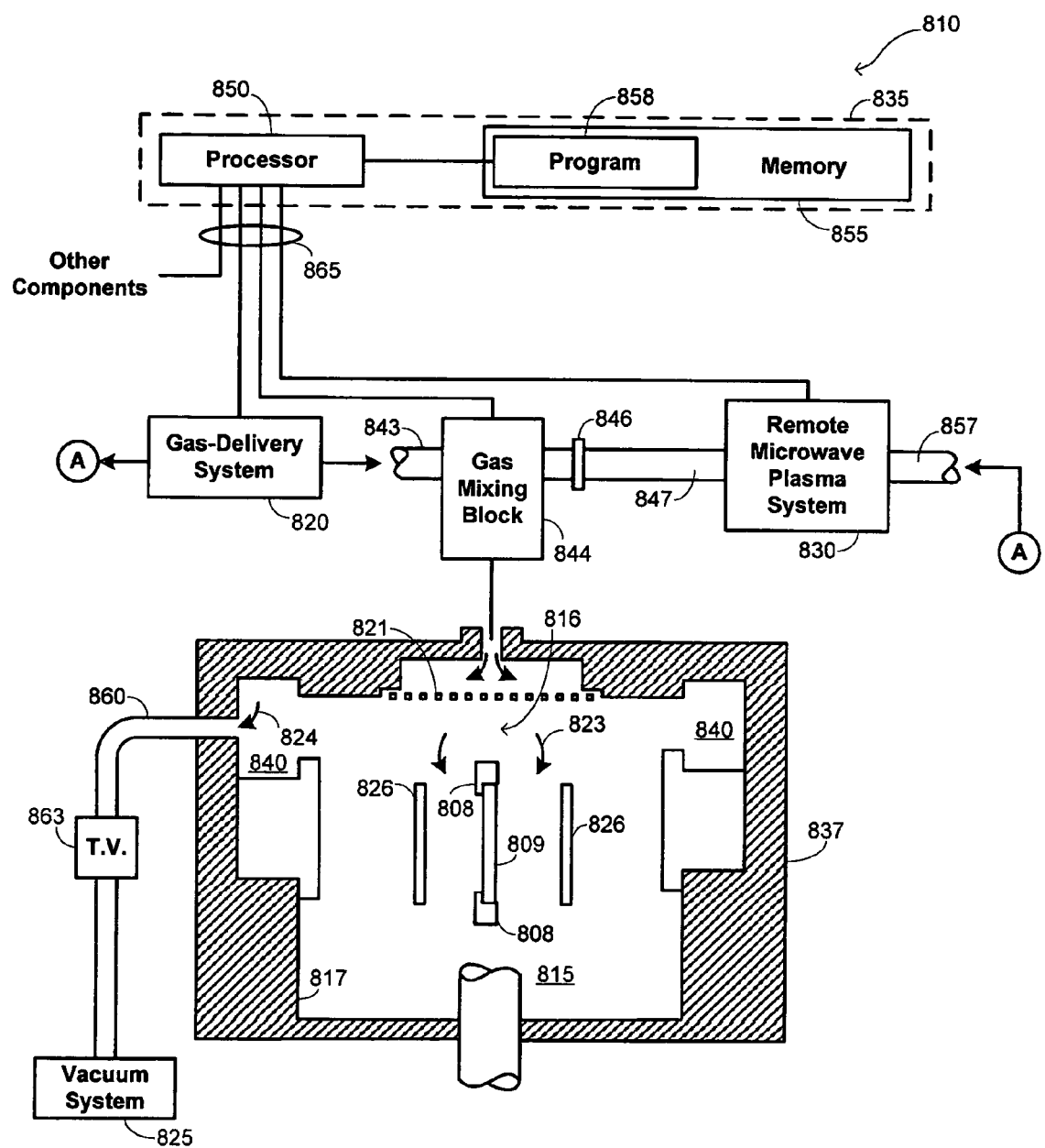
FIG. 8A is a simplified representation of an exemplary deposition apparatus that may be used in implementing embodiments of the invention.

FIG. 8A is a simplified diagram of an exemplary chemical vapor deposition ("CVD") system 810, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. As will be evident from the examples described below, in some instances multiple-step processes can still be performed within an individual chamber before removal for transfer to another chamber. The major components of the system include, among others, a vacuum chamber 815 that receives process and other gases from a gas delivery system 820, a vacuum system 825, a remote plasma system 830, and a control system 835. These and other components are described in more detail below. In addition, specific description of structural arrangements that may be used to enable dual-sided deposition are provided below. While the drawing shows the structure of only a single chamber for purposes of illustration, it will be appreciated that multiple chambers with similar structures may be provided as part of the cluster tool, each tailored to perform different aspects of the overall fabrication process. Other components shown in the drawing for supporting the chamber processing may be shared among the multiple chambers, although in some instances individual supporting components may be provided for each chamber separately.

CVD apparatus 810 includes an enclosure assembly 837 that forms vacuum chamber 815 with a gas reaction area 816. A gas distribution plate 821 disperses reactive gases and other gases, such as purge gases, through perforated holes toward one or more substrates 809 held in position by a substrate support structure 808. Between gas distribution plate 821 and the substrate 809 is gas reaction area 816. Heaters 826 can be controllably moved between different positions to accommodate different deposition processes as well as for an etch or cleaning process. A center board (not shown) includes sensors for providing information on the position of the substrate.

Different structures may be used for heaters 826. For instance, some embodiments of the invention advantageously use a pair of plates in close proximity and disposed on opposite sides of the substrate support structure 808 to provide separate heating sources for the opposite sides of one or more substrates 809. Merely by way of example, the plates may comprise graphite or SiC in certain specific embodiments. In another instance, the heaters 826 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 826 exposed to vacuum chamber 815 are made of a ceramic material, such as aluminum oxide ($Al_2O_3$ or alumina) or aluminum nitride. In another embodiment, the heaters 826 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 820 through supply lines 843 into a gas mixing box (also called a gas mixing block) 844, where they are mixed together and delivered to gas distribution plate 821. Gas delivery system 820 includes a variety of gas sources and appropriate supply lines to deliver a selected amount of each source to chamber 815 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 810, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art.

Gas mixing box 844 is a dual input mixing block coupled to process gas supply lines 843 and to a cleaning/etch gas conduit 847. A valve 846 operates to admit or seal gas or plasma from gas conduit 847 to gas mixing block 844. Gas conduit 847 receives gases from an integral remote microwave plasma system 830, which has an inlet 857 for receiving input gases. During deposition processing, gas supplied to the plate 821 is vented toward the substrate surface (as indicated by arrows 823), where it may be uniformly distributed radially across the substrate surface in a laminar flow.

Purging gas may be delivered into the vacuum chamber 815 from gas distribution plate 821 and/or from inlet ports or tubes (not shown) through the bottom wall of enclosure assembly 837. Purge gas introduced from the bottom of chamber 815 flows upward from the inlet port past the heater 826 and to an annular pumping channel 840. Vacuum system 825 which includes a vacuum pump (not shown), exhausts the gas (as indicated by arrows 824) through an exhaust line 860. The rate at which exhaust gases and entrained particles are drawn from the annular pumping channel 840 through the exhaust line 860 is controlled by a throttle valve system 863.

Remote microwave plasma system 830 can produce a plasma for selected applications, such as chamber cleaning or etching residue from a process substrate. Plasma species produced in the remote plasma system 830 from precursors supplied via the input line 857 are sent via the conduit 847 for dispersion through gas distribution plate 821 to vacuum chamber 815. Remote microwave plasma system 830 is integrally located and mounted below chamber 815 with conduit 847 coming up alongside the chamber to gate valve 846 and gas mixing box 844, which is located above chamber 815. Precursor gases for a cleaning application may include fluorine, chlorine and/or other reactive elements. Remote microwave plasma system 830 may also be adapted to deposit CVD layers flowing appropriate deposition precursor gases into remote microwave plasma system 830 during a layer deposition process.

The temperature of the walls of deposition chamber 815 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. Gas distribution manifold 821 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 835 controls activities and operating parameters of the deposition system. System controller 835 includes a computer processor 850 and a computer-readable memory 855 coupled to processor 850. Processor 850 executes system control software, such as a computer program 858 stored in memory 855. Memory 855 is preferably a hard disk drive but may be other kinds of memory, such as read-only memory or flash memory. System controller 835 also includes a floppy disk drive, CD, or DVD drive (not shown).

Processor 850 operates according to system control software (program 858), which includes computer instructions that dictate the timing, mixture of gases, chamber pressure, chamber temperature, microwave power levels, pedestal position, and other parameters of a particular process. Control of these and other parameters is effected over control lines 865, only some of which are shown in FIG. 8A, that communicatively couple system controller 835 to the heater, throttle valve, remote plasma system and the various valves and mass flow controllers associated with gas delivery system 820.

Processor 850 has a card rack (not shown) that contains a single-board computer, analog and digital input/output boards, interface boards and stepper motor controller boards. Various parts of the CVD system 810 conform to the Versa Modular European (VME) standard which defines board, card cage, and connector dimensions and types. The VME standard also defines the bus structure having a 16-bit data bus and 44-bit address bus.

Figure 8B:
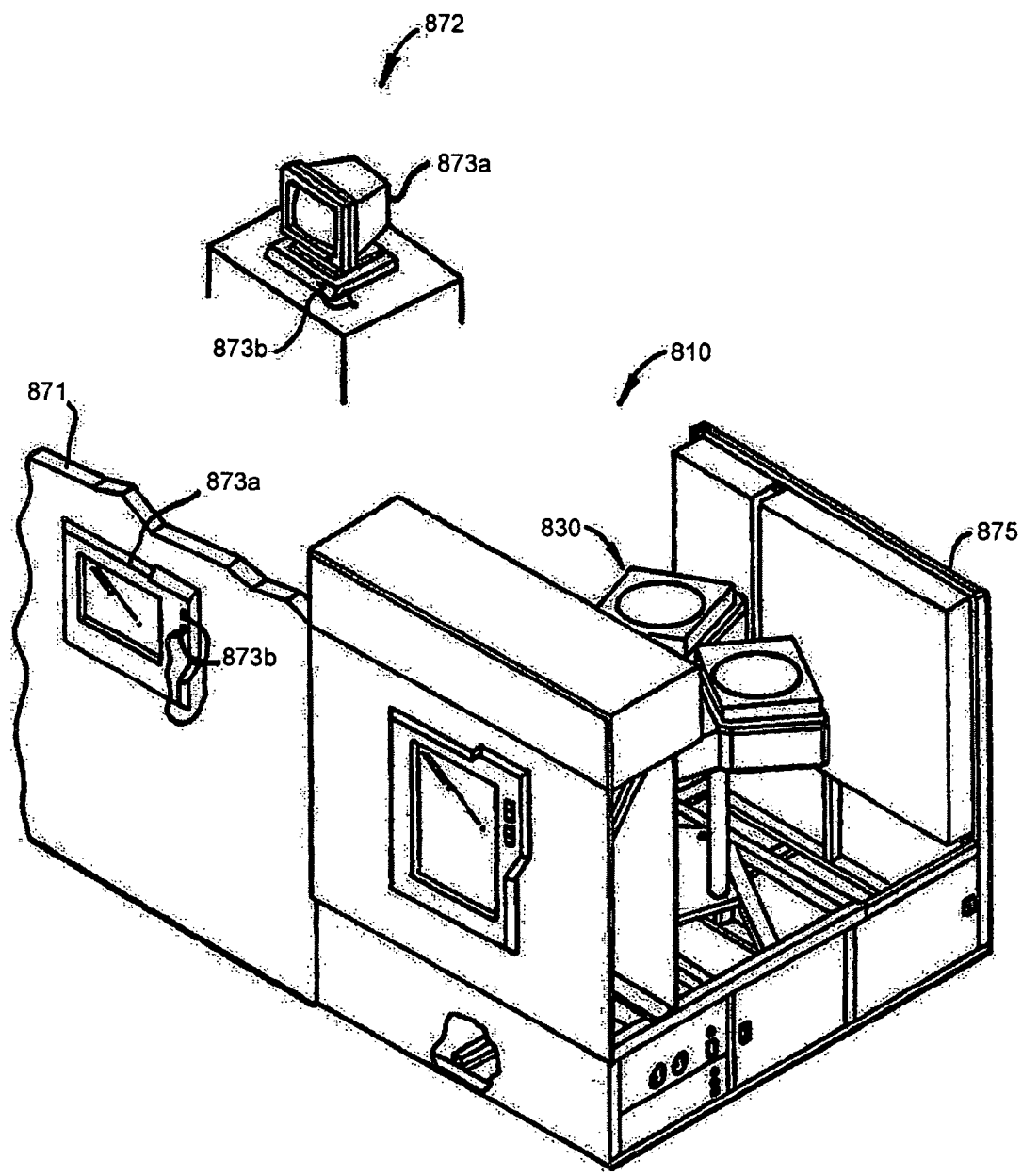
FIG. 8B is a simplified representation of an embodiment of a user interface for the exemplary deposition apparatus of FIG. 8A.

FIG. 8B is a simplified diagram of a user interface that can be used to monitor and control the operation of CVD system 810. FIG. 8B illustrates explicitly the multichamber nature of the cluster tool, with CVD system 810 being one chamber of the multichamber system. In such a multichamber system substrates may be transferred from one chamber to another via a computer-controlled robot for additional processing. In some cases the substrates are transferred under vacuum or a selected gas. The interface between a user and system controller 835 is a CRT monitor 873*a* and a light pen 873*b*. A mainframe unit 875 provides electrical, plumbing, and other support functions for the CVD apparatus 810. Exemplary multichamber system mainframe units compatible with the illustrative embodiment of the CVD apparatus are currently commercially available as the Precision 5000™ and the Centura 5200™ systems from APPLIED MATERIALS, INC. of Santa Clara, Calif.

In one embodiment two monitors 873*a* are used, one mounted in the clean room wall 871 for the operators, and the other behind the wall 872 for the service technicians. Both monitors 873*a* simultaneously display the same information, but only one light pen 873*b* is enabled. The light pen 873*b* detects light emitted by the CRT display with a light sensor in the tip of the pen. To select a particular screen or function, the operator touches a designated area of the display screen and pushes the button on the pen 873*b*. The touched area changes its highlighted color, or a new menu or screen is displayed, confirming communication between the light pen and the display screen. As a person of ordinary skill would readily understand, other input devices, such as a keyboard, mouse, or other pointing or communication device, may be used instead of or in addition to the light pen 873*b* to allow the user to communicate with the processor.

Figure 8C:
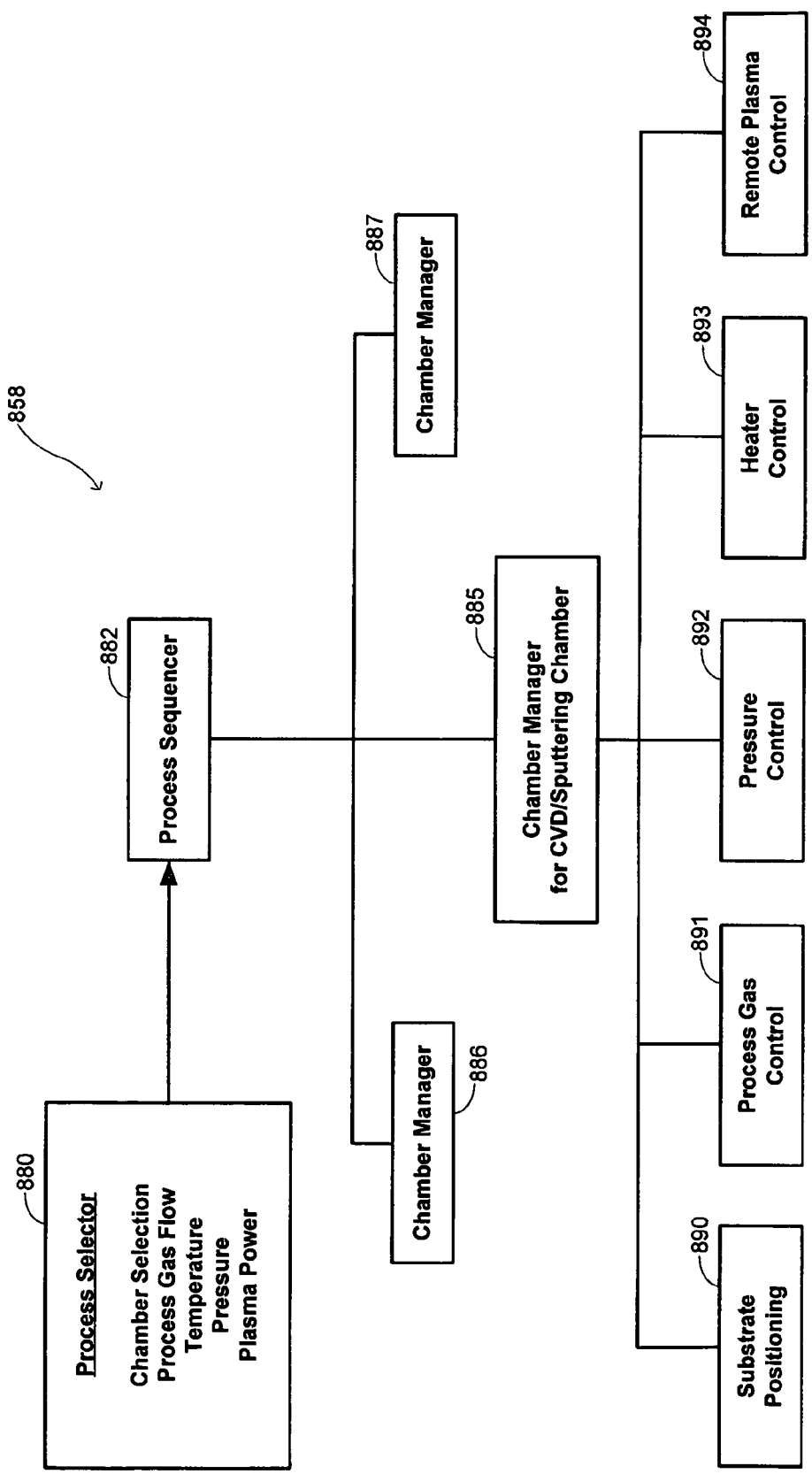
FIG. 8C is a simplified representation of an embodiment of a hierarchical control structure for system control software that may be used with the exemplary deposition apparatus of FIG. 8A.

FIG. 8C is a block diagram of one embodiment of the hierarchical control structure of the system control software, computer program 858, for the exemplary CVD apparatus of FIG. 8A. Processes such as those for depositing a layer, performing a dry chamber clean, or performing reflow or drive-in operations can be implemented under the control of computer program 858 that is executed by processor 850. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 880 by using the light pen to select a choice provided by menus or screens displayed on the CRT monitor. The process sets, which are predetermined sets of process parameters necessary to carry out specified processes, are identified by predefined set numbers. The process selector subroutine 880 identifies (i) the desired process chamber, and (ii) the desired set of process parameters needed to operate the process chamber for performing the desired process. The process parameters for performing a specific process relate to process conditions such as, for example, process gas composition and flow rates, pedestal temperature, chamber wall temperature, pressure and plasma conditions such as magnetron power levels. The process selector subroutine 880 controls what type of process (e.g., deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 882 has program code for accepting the identified process chamber and process parameters from the process selector subroutine 880, and for controlling the operation of the various process chambers. Multiple users can enter process set numbers and process chamber numbers, or a single user can enter multiple process set numbers and process chamber numbers, so process sequencer subroutine 882 operates to schedule the selected processes in the desired sequence. Preferably, process sequencer subroutine 882 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, process sequencer subroutine 882 can be designed to take into consideration the present condition of the process chamber being used in comparison with the desired process conditions for a selected process, or the "age" of each particular user-entered request, or any other relevant factor a system programmer desires to include for determining scheduling priorities.

Once process sequencer subroutine 882 determines which process chamber and process set combination is going to be executed next, process sequencer subroutine 882 initiates execution of the process set by passing the particular process set parameters to a chamber manager subroutine 885 which controls multiple processing tasks in a particular process chamber according to the process set determined by process sequencer subroutine 882. For example, chamber manager subroutine 885 has program code for controlling CVD and cleaning process operations in chamber 815. Chamber manager subroutine 885 also controls execution of various chamber component subroutines which control operation of the chamber components necessary to carry out the selected process set. Examples of chamber component subroutines are substrate positioning subroutine 890, process gas control subroutine 891, pressure control subroutine 892, heater control subroutine 893 and remote plasma control subroutine 894. Depending on the specific configuration of the CVD chamber, some embodiments include all of the above subroutines, while other embodiments may include only some of the subroutines or other subroutines not described. Those having ordinary skill in the art would readily recognize that other chamber control subroutines can be included depending on what processes are to be performed in the process chamber. In multichamber systems, additional chamber manager subroutines 886, 887 control the activities of other chambers.

In operation, the chamber manager subroutine 885 selectively schedules or calls the process component subroutines in accordance with the particular process set being executed. Chamber manager subroutine 885 schedules the process component subroutines much like the process sequencer subroutine 882 schedules which process chamber and process set are to be executed next. Typically, chamber manager subroutine 885 includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 8A and 8C. The substrate positioning subroutine 890 comprises program code for controlling chamber components that are used to load the substrate onto the heater 826 and, optionally, to lift the substrate to a desired height in the chamber to control the spacing between the substrate and the gas distribution manifold 821. When a substrate is loaded into the process chamber 815, the heater 826 is lowered to receive the substrate and then the heater 826 is raised to the desired height. In operation, the substrate positioning subroutine 890 controls movement of the heater 826 in response to process set parameters related to the support height that are transferred from the chamber manager subroutine 885.

Process gas control subroutine 891 has program code for controlling process gas composition and flow rates. Process gas control subroutine 891 controls the state of safety shut-off valves, and also ramps the mass flow controllers up or down to obtain the desired gas flow rate. Typically, process gas control subroutine 891 operates by opening the gas supply lines and repeatedly (i) reading the necessary mass flow controllers, (ii) comparing the readings to the desired flow rates received from the chamber manager subroutine 885, and (iii) adjusting the flow rates of the gas supply lines as necessary. Furthermore, process gas control subroutine 891 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 891 is programmed to include steps for flowing the inert gas into the chamber for an amount of time necessary to stabilize the pressure in the chamber, and then the steps described above would be carried out. Additionally, when a process gas is to be vaporized from a liquid precursor, process gas control subroutine 891 is written to include steps for bubbling a delivery gas such as helium through the liquid precursor in a bubbler assembly, or controlling a liquid injection system to spray or squirt liquid into a stream of carrier gas, such as helium. When a bubbler is used for this type of process, process gas control subroutine 891 regulates the flow of the delivery gas, the pressure in the bubbler, and the bubbler temperature in order to obtain the desired process gas flow rates. As discussed above, the desired process gas flow rates are transferred to process gas control subroutine 891 as process parameters.

Furthermore, process gas control subroutine 891 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 892 includes program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 892 is invoked, the desired or target pressure level is received as a parameter from the chamber manager subroutine 885. Pressure control subroutine 892 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values. Alternatively, the pressure control subroutine 892 can be written to open or close the throttle valve to a particular aperture size, i.e., a fixed position, to regulate the pressure in the chamber. Controlling the exhaust capacity in this way does not invoke the feedback control feature of the pressure control subroutine 892.

Heater control subroutine 893 includes program code for controlling the current to a heating unit that is used to heat the substrate. Heater control subroutine 893 is also invoked by the chamber manager subroutine 885 and receives a target, or set-point, temperature parameter. Heater control subroutine 893 measures the temperature, which may be performed in different ways in different embodiments. For instance, a calibrated temperature may be determined by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. In another embodiment, a similar process may be performed with a pyrometer instead of a thermocouple to determine a calibrated temperature. Heater control subroutine 893 includes the ability to gradually control a ramp up or down of the heater temperature. In embodiments where the heater comprises a resistive heating element enclosed in ceramic, this feature helps to reduce thermal cracking in the ceramic, although this is not a concern in those embodiments that use a lamp heater Additionally, a built-in fail-safe mode can be included to detect process safety compliance, and can shut down operation of the heating unit if the process chamber is not properly set up.

Remote plasma control subroutine 894 includes program code to control the operation of remote plasma system 830. Plasma control subroutine 894 is invoked by chamber manager 885 in a manner similar to the other subroutines just described.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, is software, hardware or both. Those skilled in the art will also realize that it would be a matter of routine skill to select an appropriate computer system to control CVD system 810.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of suppressing parasitic particle formation in a metal organic chemical vapor deposition process, the method comprising:
    providing a substrate to a reaction chamber;
    introducing an organometallic precursor and a particle suppression compound to the reaction chamber wherein the particle suppression compound has a lower partial pressure in the reaction chamber than the organometallic precursor to increase growth rate;
    introducing at least a second precursor to the reaction chamber, wherein the second precursor reacts with the organometallic precursor; and
    forming a nucleation layer on the substrate from a reaction mixture comprising the organometallic precursor and the second precursor.

2. The particle suppression method of claim 1, wherein the particle suppression compound prevents the second precursor from forming parasitic particles in the reaction chamber.

3. The particle suppression method of claim 1, wherein the substrate comprises an aluminum or silicon material.

4. The particle suppression method of claim 3, wherein the aluminum material comprises sapphire.

5. The particle suppression method of claim 3, wherein the silicon material comprises substantially pure silicon or silicon carbide.

6. The particle suppression method of claim 1, wherein the substrate comprises spinel, lithium gallate, or zinc oxide.

7. The particle suppression method of claim 1, wherein the organometallic precursor comprises an organo-gallium compound.

8. The particle suppression method of claim 7, wherein the organo-gallium compound comprises trimethyl gallium.

9. The particle suppression method of claim 1, wherein the particle suppression compound comprises a halogen compound.

10. The particle suppression method of claim 9, wherein the halogen compound comprises a hydrogen halide.

11. The particle suppression method of claim 10, wherein the hydrogen halide comprises hydrogen fluoride, hydrogen chloride, hydrogen bromide, or hydrogen iodide.

12. The particle suppression method of claim 1, wherein the second precursor comprises ammonia.

13. The particle suppression method of claim 1, wherein the nucleation layer comprises gallium nitride, or an alloy of gallium nitride.

14. The particle suppression method of claim 1, wherein the particle suppression compound has a partial pressure in the reaction chamber that is less than half the partial pressure the organometallic precursor.

15. The particle suppression method of claim 1, wherein the organometallic precursor and the particle suppression compound have a temperature of less than 300° C. when they are introduced into the reaction chamber.

16. The particle suppression method of claim 1, wherein the organometallic precursor and the particle suppression compound have a temperature from 15° C. to 300° C. when they are introduced into the reaction chamber.

17. The particle suppression method of claim 1, wherein the method comprises introducing a third precursor to the reaction chamber that reacts with the organometallic precursor and the second precursor to form the nucleation layer.

18. The particle suppression method of claim 1, wherein the method further comprises forming a epitaxial layer on the nucleation layer with a hydride vapor-phase epitaxy process.

19. The particle suppression method of claim 18, wherein the hydride vapor-phase epitaxy process comprises:
   introducing a metal containing reagent gas into the reaction chamber, wherein the metal containing reagent gas is generated from the reaction of a metal with a halogen containing gas; and
   introducing a second reagent gas into the reaction chamber, wherein the second reagent gas reacts with the metal containing reagent gas; and
   forming the epitaxial layer on the nucleation layer from an epitaxial reaction gas mixture comprising the metal containing gas and the second reagent gas.

20. The particle suppression method of claim 19, wherein the metal reaction with the halogen containing gas is a liquid metal selected from the group consisting of aluminum, gallium, and indium.

21. The particle suppression method of claim 19, wherein the metal containing reagent gas comprises aluminum chloride, gallium chloride, or indium chloride.

22. The particle suppression method of claim 19, wherein the halogen containing gas comprises hydrogen chloride.

23. The particle suppression method of claim 19, wherein the second reagent gas comprises ammonia.

24. The particle suppression method of claim 18, wherein the epitaxial layer comprises aluminum nitride, or indium nitride.

25. The particle suppression method of claim 18, wherein the epitaxial layer comprises gallium nitride, or alloys of gallium nitride.

26. The particle suppression method of claim 18, wherein the nucleation layer has a thickness of about 100 Å to about 1000 Å, and the epitaxial layer has a thickness of about 1 µm or more.

27. A method of suppressing parasitic particle formation during formation of a III-V nitride layer, the method comprising:
   providing a substrate to a reaction chamber;
   introducing a group III metal containing precursor to the reaction chamber, wherein the group III metal precursor also comprises a halogen, wherein the halogen suppresses the parasitic particle formation;
   introducing a hydrogen halide gas to the reaction chamber, wherein the hydrogen halide is also introduced to the reaction chamber at a lower flow rate than the group III metal precursor to suppress the parasitic particle formation; and
   introducing a nitrogen containing compound to the reaction chamber, wherein the nitrogen containing compound reacts with the group III metal precursor to form the III-V nitride layer on the substrate.

28. The method of suppressing parasitic particle formation of claim 27, wherein the method further comprises introducing a second metal precursor, wherein the second metal precursor comprises a different metal than the group III metal precursor, and wherein the III-V nitride layer comprises a group III metal alloy.

29. The method of suppressing parasitic particle formation of claim 27, wherein the group III metal precursor comprises aluminum chloride, gallium chloride, or indium chloride.

30. The method of suppressing parasitic particle formation of claim 27, wherein the nitrogen containing compound comprises ammonia.

31. The method of suppressing parasitic particle formation of claim 27, wherein the group III-V nitride layer comprises aluminum nitride, gallium nitride, or indium nitride.

32. The method of suppressing parasitic particle formation of claim 27, wherein the group III-V nitride layer comprises an alloy of gallium nitride.

33. The method of suppressing parasitic particle formation of claim 27, wherein the hydrogen halide is introduced to the reaction chamber at less than half the flow rate of the group III metal precursor.

34. The method of suppressing parasitic particle formation of claim 27, wherein the hydrogen halide is introduced to the reaction chamber at less than 300° C.

35. A method of suppressing parasitic particle formation during formation of a gallium nitride layer on a sapphire substrate, the method comprising:
   introducing ammonia to a reaction chamber that contains the sapphire substrate;
   introducing an organo-gallium compound and hydrogen chloride to the reaction chamber, wherein the hydrogen chloride suppresses the formation of parasitic particles by the ammonia; and
   forming a gallium nitride layer on the sapphire substrate, wherein the hydrogen chloride has a lower partial pressure in the reaction chamber than the organo-gallium compound.

36. The method of suppressing parasitic particle formation of claim 35, wherein the organo-gallium compound is trimethyl gallium.

37. The method of suppressing parasitic particle formation of claim 35, wherein the hydrogen chloride is introduced into the reaction chamber at less than 300° C.

38. The method of suppressing parasitic particle formation of claim 35, wherein the organo-gallium compound and the hydrogen chloride are simultaneously introduced to the reaction chamber at less than 300° C.

* * * * *